(12) United States Patent
Herron

(10) Patent No.: US 7,320,835 B2
(45) Date of Patent: *Jan. 22, 2008

(54) PHOSPHORESCENT MATERIAL

(75) Inventor: Norman Herron, Newark, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 546 days.

This patent is subject to a terminal disclaimer.

(21) Appl. No.: 11/012,036

(22) Filed: Dec. 14, 2004

(65) Prior Publication Data

US 2005/0196637 A1 Sep. 8, 2005

Related U.S. Application Data

(63) Continuation-in-part of application No. 10/650,323, filed on Aug. 28, 2003, now Pat. No. 7,198,730.

(51) Int. Cl.
*H01L 51/54* (2006.01)
*C09K 11/06* (2006.01)

(52) U.S. Cl. .................. 428/690; 428/917; 313/504; 313/506; 257/40; 257/E51.044; 546/4; 556/21

(58) Field of Classification Search ............... None
See application file for complete search history.

(56) References Cited

U.S. PATENT DOCUMENTS

| | | |
|---|---|---|
| 2001/0019782 A1 | 9/2001 | Igarashi et al. |
| 2001/0053462 A1 | 12/2001 | Mishima |
| 2002/0022149 A1 | 2/2002 | Watanabe et al. |
| 2002/0024293 A1 | 2/2002 | Igarashi et al. |
| 2002/0034656 A1 | 3/2002 | Thompson et al. |
| 2002/0048689 A1 | 4/2002 | Igarashi et al. |
| 2002/0055014 A1 | 5/2002 | Okada et al. |
| 2002/0063516 A1 | 5/2002 | Tsuboyama et al. |
| 2002/0064681 A1 | 5/2002 | Takiguchi et al. |
| 2002/0068190 A1 | 6/2002 | Tsuboyama et al. |
| 2002/0182441 A1 | 12/2002 | Lamansky et al. |
| 2003/0017361 A1 | 1/2003 | Thompson et al. |
| 2003/0059646 A1 | 3/2003 | Kamatani et al. |
| 2003/0068526 A1 | 4/2003 | Kamatani et al. |
| 2003/0162299 A1 | 8/2003 | Hsieh et al. |
| 2003/0173896 A1 | 9/2003 | Grushin et al. |

FOREIGN PATENT DOCUMENTS

| | | |
|---|---|---|
| EP | 1 191 612 A2 | 3/2002 |
| EP | 1 191 613 A2 | 3/2002 |
| EP | 1 191 614 A2 | 3/2002 |
| EP | 1 348 711 A1 | 10/2003 |
| EP | 1 349 435 A1 | 10/2003 |
| JP | 2003-73387 A | 3/2003 |
| WO | WO 00/70655 A2 | 11/2000 |
| WO | WO 01/41512 A1 | 6/2001 |
| WO | WO 02/15645 A1 | 2/2002 |
| WO | WO 02/074015 A2 | 9/2002 |
| WO | WO 03/000661 A1 | 1/2003 |

OTHER PUBLICATIONS

Lee, Hae Won et al., Electrophorescent Light Emitting Devices Using Mixed Ligand Ir(III) Complexes, Mat. Res. Soc. Sym. Proc., 2002, 119-123, 708, Materials Research Society.
Grundemann, Stephan et al., Abnormal Ligand Binding and Reversible Ring Hydrogenation in the Reaction of Imidazolium Salts with IrH3(PPh3)2, J. Am. Chem. Soc., 2002, 10473-10481, 124, American Chemical Society.
Kawamura, Yuichiro et al., Engergy transfer in polymer electrophosphorescent light emitting devices with single and multiple doped luminescent layers, Journal of Applied Physics, Jul. 1, 2002, 87-93, 92(1):, American Institute of Physics.
Lamansky, Sergey et al., Cyclometalated Ir complexes in polymer organic light-emitting devices, Journal of Applied Physics, Aug. 1, 2002, 1570-1575, 92(3), American Institute of Physics.
C. W. Tang et al., Organic Electroluminescent diodes, Applied Physics Letters, vol. 51:913-915, 1987.

*Primary Examiner*—Marie Yamnitzky
(74) *Attorney, Agent, or Firm*—John H. Lamming

(57) ABSTRACT

An organometallic complex, comprises at least one transition metal, at least one first monoanionic bidentate ligand coordinated through a nitrogen on a heteroaromatic ring and a carbon, and at least one second ligand selected from a hydride and a ligand coordinated through a carbon atom which is part of an aromatic group. Methods for making the complex and its uses in electronic devices are also presented.

24 Claims, 4 Drawing Sheets

PHOSPHORESCENT MATERIAL

CROSS REFERENCE TO RELATED APPLICATIONS

This is a continuation-in-part of application U.S. Ser. No. 10/650,323, filed Aug. 28, 2003 now U.S. Pat. No. 7,198,730.

BACKGROUND OF THE INVENTION

1. Field of the Invention

The invention relates generally to a transition metal complex and more particularly to a transition metal complex used in an electronic device.

2. Background Information

Research and development relating to various kinds of display devices are actively carried out today. In particular, organic electroluminescent elements have received attention as promising display elements because of their ability to emit light at a low voltage. For example, a light-emitting device having an organic thin film formed by vapor deposition of an organic compound has been known (*Applied Physics Letters*, Vol. 51, p. 913 (1987)). Research has revealed that high power efficiency organic electroluminescent devices, such as organic light emitting diode (OLED) devices, can be made using molecules that emit light from their triplet state.

Light emission from the triplet state, as opposed to light emission from the singlet state, is referred to as phosphorescence. The triplet excitons can produce phosphorescence, whereas the singlet excitons typically produce fluorescence. Since the lowest emissive singlet excited state of an organic molecule is typically at a slightly higher energy than the lowest triplet excited state, the singlet excited state may relax, by an intersystem crossing process, to the emissive triplet excited state. This means that all the exciton excitation energy may be converted into triplet state excitation energy, which then becomes available as phosphorescent emission. Since all the exciton excitation energy can become available as electrophosphorescence, electrophosphorescent devices have a maximum theoretical quantum efficiency of 100%.

In recent years, much effort has been geared to application of organic electroluminescent devices to full color displays and white light sources. As known, full color display devices require red, green, and blue light sources (RGB). Thus, in order to produce a full color display that takes advantage of the high power efficiency of organic electroluminescent devices, a triplet emissive blue is needed as well as high efficiency triplet emissive red and green materials. Examples of triplet emissive red and green materials are already in existence. However, triple emissive blue has been difficult to attain due to the high energy of the emissive state. Efficient long-lived blue-light emitters with good color coordinates are a recognized current shortfall in the field of organic electroluminescent devices.

Although some light-emitting devices have been reported to emit blue light, there has been no report of blue light-emitting device having an external quantum efficiency exceeding 5%. If a blue light-emitting device having an external quantum efficiency exceeding 5% could be provided, application of light-emitting devices would be greatly expanded. Moreover, it would be possible to significantly reduce electrical power consumption, since electrical appliances use these electroluminescent devices.

SUMMARY OF THE INVENTION

An organometallic complex comprising:
at least one transition metal M,
at least one first monoanionic bidentate ligand coordinated through a nitrogen on a heteroaromatic ring and a carbon, and
at least one second ligand selected from a hydride and a ligand coordinated through a carbon atom which is part of an aromatic group.

The electronic device of the invention includes a photoactive layer, between two electrode layers and a layer of charge transport material located between the photoactive layer and each electrode layer, wherein at least one of the photoactive layer, the electrode layer, and the layer of charge transport material includes at least one organometallic complex described above.

One embodiment of the above composition of matter is prepared by mixing 2-(2,4-difluorophenyl)-4-methylpyridine with iridium chloride to form a mixture, adding triphenylphosphine and sodium bicarbonate to the mixture, drying the mixture, and extracting the mixture into methylene chloride.

Other features and advantages of the invention will be apparent from the following detailed description, and from the claims.

DETAILED DESCRIPTION

Figure 1:
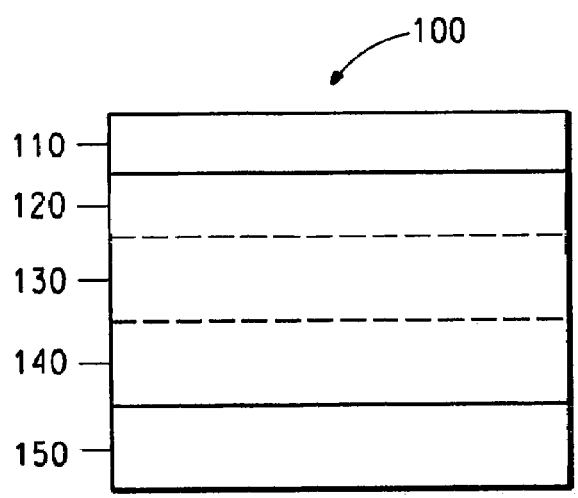
FIG. 1 is an exemplary organic light emitting diode (OLED) device that may include the organometallic complex of the invention.

An organometallic complex comprising:
at least one transition metal M,
at least one first monoanionic bidentate ligand coordinated through a nitrogen on a heteroaromatic ring and a carbon, and
at least one second ligand selected from a hydride and a ligand coordinated through a carbon atom which is part of an aromatic group.

The electronic device of the invention includes a photoactive layer, between two electrode layers and a layer of charge transport material located between the photoactive layer and each electrode layer, wherein at least one of the photoactive layer, the electrode layer, and the layer of charge transport material includes at least one organometallic complex described above.

One embodiment of the above composition of matter is prepared by mixing 2-(2,4-difluorophenyl)-4-methylpyridine with iridium chloride to form a mixture, adding triphenylphosphine and sodium bicarbonate to the mixture, drying the mixture, and extracting the mixture into methylene chloride.

Unless otherwise defined, all technical and scientific terms used herein have the same meaning as commonly understood by one of ordinary skill in the art to which this invention belongs. In the formulae, all letters not otherwise defined, are used to designate conventional atomic symbols. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

"Blue," as used herein, indicates any color that appears bluish to the naked human eye, including light of wavelengths ranging from 440 nm to 540 nm. A "luminescent material" is a material that emits light when activated by an applied voltage (such as in a light-emitting diode or light-emitting electrochemical cell) or in response to radiant energy. An "organometallic complex," as used herein, is a metal atom having organic ligands. "Room temperature," as used herein, is a temperature between 15-35° C. at about 1 atmosphere pressure. "Peak efficiency," as used herein, is the highest point of a curve in an efficiency-vs.-voltage curve, provided in units of cd/A. Peak efficiency is generally used to indicate the number of photons emitted per electrons injected. "Peak radiance" is the highest point of a curve in an radiance-vs.-voltage curve, provided in units of cd/m². It signifies the amount of light (the number of photons) that are emitted per unit area. "Phosphorescent emission" as used herein, is emission from an excited state having a lifetime between 10 nanoseconds and 10 microseconds.

As used herein, the term "group" is intended to mean a part of a compound, such as a substituent in an organic compound. The prefix "hetero" indicates that one or more carbon atoms have been replaced with a different atom. The prefix "fluoro" indicates that one or more hydrogen atoms have been replaced with a fluorine.

The term "alkyl" is intended to mean a group derived from an aliphatic hydrocarbon having one point of attachment. In one embodiment, the alkyl group contains from 1-20 carbon atoms. The term "aryl" is intended to mean a group derived from an aromatic hydrocarbon having one point of attachment. In one embodiment, the aryl group contains from 6-30 carbon atoms. In one embodiment, a heteroaryl group contains from 4-30 carbon atoms.

The phrase "X is selected from A, B, and C" is equivalent to the phrase "X is selected from the group consisting of A, B, and C", and is intended to mean that X is A, or X is B, or X is C. The phrase "X is selected from 1 through n" is intended to mean that X is 1, or X is 2, ... or X is n.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organometallic Complex

The complexes of the invention comprise a transition metal element M, at least one first ligand which is a monoanionic bidentate ligand coordinated through a nitrogen on a heteroaromatic ring and a carbon, at least one second ligand selected from a hydride and a ligand coordinated through a carbon atom which is part of an aromatic group Formula IV shows an exemplary general structure of the compositions of the invention, wherein the metal is a transition metal listed in Groups 3-12 of the Periodic Table, and the first ligand is represented by C-N. The IUPAC numbering system is used throughout, where the groups from the Periodic Table are numbered from left to right as 1-18 (CRC Handbook of Chemistry and Physics, 81$^{st}$ Edition, 2000). In the figure, A represents a monoanionic ligand attachment and B represents a nonionic ligand attachment, wherein at least one of A is a hydride or a carbon atom which is part of an aromatic group, and further wherein one or more of the A's and B's can be bonded together with linking groups.

In one embodiment, M is a transition metal that produces an efficient phosphorescent emission at room temperature from a mixture of metal-to-ligand charge transfer and π-π* ligand states. In another embodiment, the phosphorescent emission at room temperature may result from a mixture of ligand-to-metal charge transfer and π-π* ligand states. In one embodiment, M is a metal selected from Groups 8 through 11. In one embodiment, M is a metal selected from Ir, Rh, Ru, and Os.

In one embodiment, the first ligand is an arylheterocycle or a heteroarylheterocycle. In one embodiment, the first ligand is selected from ligands having Formula I or Formula II below.

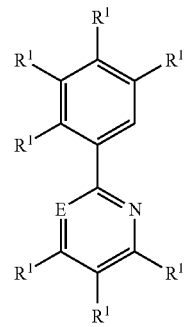

Formula I

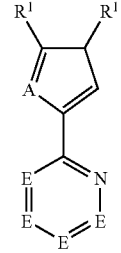

Formula II wherein:
R$^1$ is the same or different at each occurrence and is selected from H, D, C$_n$H$_{2n+1}$, C$_n$H$_{n-1}$, OR$^2$, SR$^2$, N(R$^2$)$_2$, F, C$_n$(H+F)$_{2n+1}$, OC$_n$(H+F)$_{2n+1}$, OC$_n$H$_{n-1}$, and OCF$_2$X, or adjacent pairs of R$^1$ can be joined to form a five- or six-membered ring;

R$^2$ is the same or different at each occurrence and is H, C$_n$H$_{2n+1}$, or C$_n$(H+F)$_{2n+1}$ A is S or NR$^2$; E is the same or different at each occurrence and is N or CR$^1$;

X is H, Cl, or Br; and n is an integer from 1 through 20.

The first ligand may be selected from phenylpyridines, phenylpyrimidines, and phenylquinolines or phenylisoquinolines, which may have R$^1$ substituents as discussed above.

In one embodiment, the second ligand is a ligand having the general Formula III

    Formula III wherein Ar is an aromatic group, Y is a group having a heteroatom capable of coordinating to metal M, m is 0 or an integer from 1 through 20, p is an integer from 1 through 5, and further wherein one or more of the carbons in (CH$_2$)$_m$ can be replaced with a heteroatom and one or more of the hydrogens in (CH$_2$)$_m$ can be replaced with D or F.

In one embodiment, Y is selected from NR$^2_2$, OR$^2$, SR$^2$, and PR$^3_2$, wherein R$^2$ is the same or different at each occurrence and is H, C$_n$H$_{2n+1}$ or C$_n$(H+F)$_{2n+1}$ and R$^3$ is the same or different at each occurrence and is selected from H, R$^2$, Ar and substituted Ar.

In one embodiment, Ar is phenyl, m is 1, Y is P(Ar)$_2$, and p is 1 or 2.

The organometallic complexes of the invention can comprise additional ligands coordinated to metal M. These can be any conventional ligand and can be neutral or anionic. In one embodiment, the organometallic complex is an overall neutral molecule, and the additional ligands have the correct charge to balance the charges of the metal and other ligands. Examples of suitable additional ligands include, but are not limited to, permutations of amines, phosphines, alkoxides, halides, hydrides or orthometalated aryl groups.

In one embodiment, the composition can be represented by formula IV below:

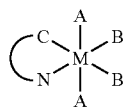    Formula IV wherein M represents a metal as described above, C—N represents the first ligand, A represents a monoanionic ligand attachment, B represents a nonionic ligand attachment, A's and B's can be linked together in any combination, and at least one of A is a hydride or carbon which is part of an aromatic group. In one embodiment, M is one of Ir, Rh, Ru, and Os. Examples of different A and B linkages are given in Formulae IV(a) through IV(d) below.

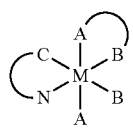    Formula IV(a)

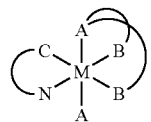    Formula IV(b)

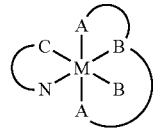    Formula IV(c)

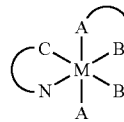    Formula IV(d)

In one embodiment, the ligands and the metal form a neutral complex that, in many cases, can provide blue photo-luminescence and electro-luminescence The emitted color is tuned by combinations of electron-donating and electron-withdrawing substituents, and is generally at a shorter wavelength for these mono-phenylpyridino complexes than for the corresponding bis- or tris-cyclometalated phenylpyridino complexes.

Good color coordinates for blue emission are realized. Desirable color coordinate ranges for a blue material, which are typically 0.1<X<0.25 and Y<0.22, according to the 1931 CIE convention, have been achieved.

In one embodiment, the organometallic complex comprises:

a hexacoordinate transition metal, M, selected from Ir, Os, Ru, and Rh;

a first monoanionic bidentate ligand having Formula V

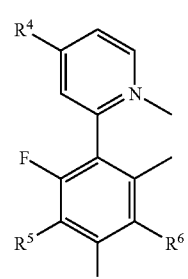    Formula V a hydride ligand;

a second monoanionic bidentate ligand comprising a phosphino alkoxide; and a monodentate phosphine ligand;

wherein

R$^4$ is a group comprising an unsaturated 5-membered heteroring containing nitrogen and attached via the nitrogen, and R$^5$ and R$^6$ are independently selected from H, alkyl, fluoroalkyl, fluoroalkylsulfonate, alkoxy, fluoroalkoxy, carboxyl, and cyano.

The ligand of Formula V is a phenylpyridine which is coordinated to the metal, M, through the pyridine nitrogen and a carbon on the phenyl ring. The ligand has a substituent, $R^4$, on the pyridine ring. The substituent comprises an unsaturated 5-membered heteroring containing nitrogen. As used herein, the term "heteroring" is intended to mean a cyclic structure formed with at least one heteroatom. $R^4$ is bonded to the pyridine ring via the nitrogen of the heteroring. The heteroring of $R^4$ can have more than one heteroatom. The heteroring of $R^4$ can be only partially unsaturated and not aromatic, or it can be fully unsaturated and aromatic.

In one embodiment, the heteroring of $R^4$ is selected from an aromatic pyrrole-type ring and a non-aromatic dihydropyrrole-type ring, as illustrated below.

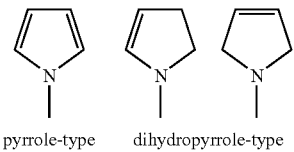

pyrrole-type  dihydropyrrole-type

In one embodiment, $R^4$ is selected from carbazole and indole groups, which may be further substituted. Examples of substituents include, but are not limited to, alkyl, aryl, heteroalkyl, heteroaryl, alkoxy, and carboxy groups.

In one embodiment, $R^4$ is selected from the groups below:

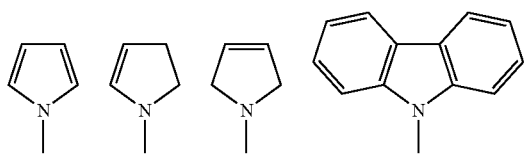

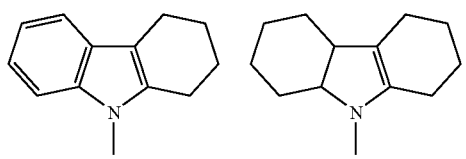

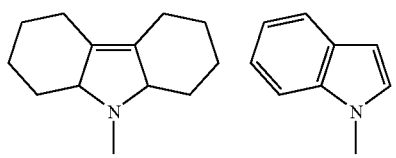

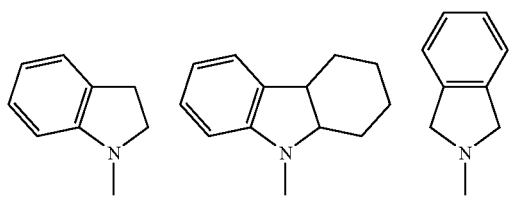

In one embodiment, $R^5$ is selected from H, alkyl and fluoroalkyl. In one embodiment, $R^5$ is selected from H, $-CF_3$, $-C_3F_7$, and $-C(CF_3)OCH_3$. The perfluoropropyl group can be normal or isopropyl.

In one embodiment, $R^6$ is H.

In one embodiment, the second monoanionic bidentate ligand is a phosphino alkoxide. These ligands are coordinated through the phosphorus atom and the negatively charged oxygen atom. Phosphino alkoxide ligands generally have Formula VI:

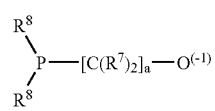

Formula VI where
$R^7$ can be the same or different at each occurrence and is selected from H and $C_n(H+F)_{2n+1}$,
$R^8$ can be the same or different at each occurrence and is selected from $C_n(H+F)_{2n+1}$ and $C_6(H+F)_5$, or $C_6H_{5-b}(R^9)_b$,
$R^9 = CF_3$, $C_2F_5$, n-$C_3F_7$, i-$C_3F_7$, $C_4F_9$, $CF_3SO_2$, and
a is 2 or 3;
b is 0-5; and
n is 1-20.

In one embodiment of the phosphinoalkoxide of Formula VI, $R^8$ is $C_6F_5$ or $C_6H_cY_{5-c}$, where Y is $CF_3$ and c is 3 or 4. In one embodiment, at least one of $R^7$ is $CF_3$ and a is 2.

Examples of some phosphinoalkanol compounds, with the abbreviation in brackets, include, but are not limited to:

1-diphenylphosphino-2-propoxide [dppO]

1-bis(trifluoromethyl)-2-(diphenylphosphino)ethoxide [PO-1]

1,1-bis(trifluoromethyl)-2-(bis(3'5'-ditrifluoromethylphenyl)phosphino)ethoxide [PO-2]

1,1-bis(trifluoromethyl)-2-(bis(4'-trifluoromethylphenyl)phosphino)ethoxide [PO-3]

1,1-bis(trifluoromethyl)-2-(bis(pentafluorophenyl)phosphino)ethoxide [PO-4]

The ligands are derived from the corresponding phosphinoalkanol compounds in which the oxygen is protonated. The preparation of these types of compounds has been described in Grushin et al., published US application 2003/173896. The monodentate phosphine ligand generally has Formula VII:

$P(Ar)_2R^{10}$

Formula VII where
Ar is selected from aryl, fluoroaryl, heteroaryl, and fluoroheteroaryl, and
$R^{10}$ is selected from aryl, fluoroaryl, heteroaryl, fluoroheteroaryl, alkyl, fluoroalkyl, alkanol, and fluoroalkanol.

In some embodiments, the mondentate phosphine ligand can be a phosphinoalkanol, as discussed above, which is coordinated only through the phosphorus atom.

In one embodiment, the metal is Ir.

In one embodiment, the compositions having a ligand of Formula V as discussed above, are blue emissive materials.

In one embodiment, the compositions are selected from Compounds A through G below:

Compound A

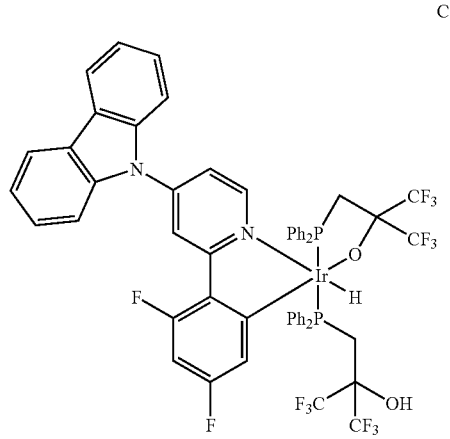

Compound B

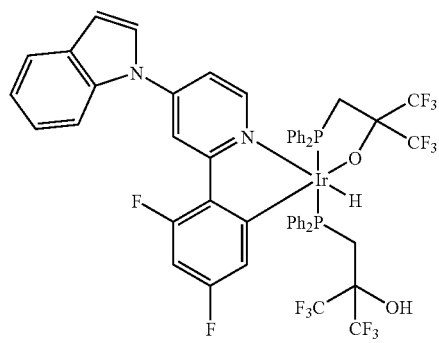

Compound C

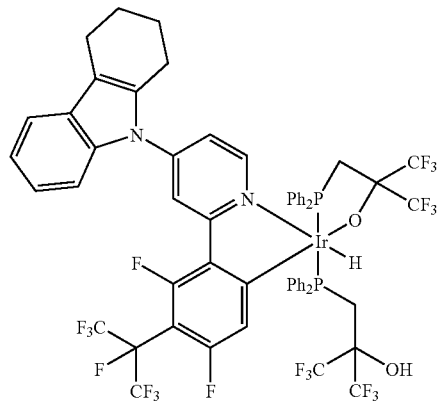

Compound D

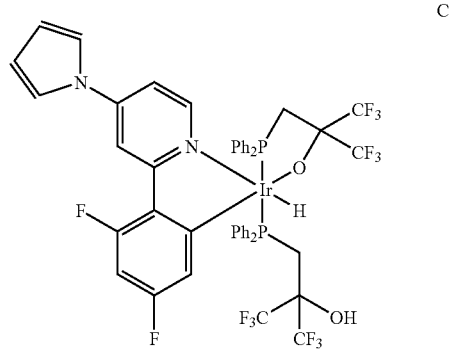

-continued

Compound E

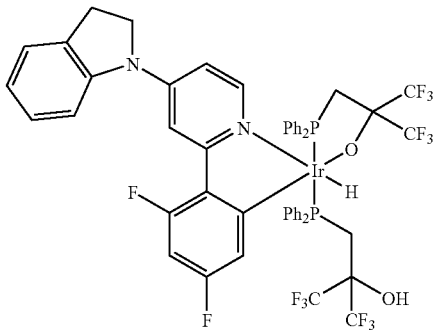

Compound F

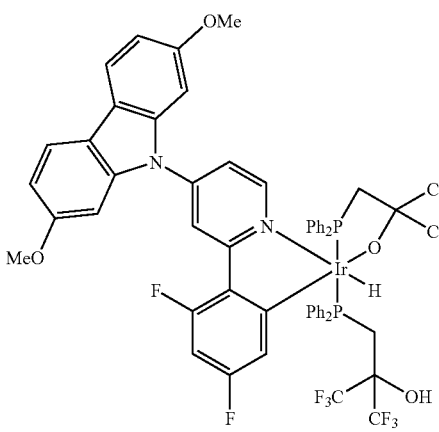

Compound G

These organometallic complexes can generally be synthesized by a sequential reaction sequence. For example, an iridium hydride complex can be synthesized using the following generalized steps. Iridium trichloride and the selected phenylpyridino type first ligand are mixed in a molar ratio of 1:1 in a mixed solvent of water:2-ethoxyethanol 1:9 by volume. This mixture is refluxed under a nitrogen atmosphere for between 15 and 60 mins. The reaction mixture is then cooled and 2 molar equivalents of an additional ligand are added along with up to 3 molar equivalents of sodium bicarbonate. The mixture is then further refluxed under nitrogen for another period of 15-60 mins. The mixture is then cooled and the water/ethoxyethanol solvent removed by evaporation leaving a solid residue. Extraction of this residue into methylene chloride and filtration provides a solution of the desired emissive complex. Standard purification (recrystallization from methylene chloride/methanol mixtures or silica chromatography using methylene chloride eluent) results in the purified complex for testing as an electroluminescent material.

Electronic Device

The organometallic complex described above may be incorporated into an electronic device. More specifically, this organometallic complex may be used in the light emitting layer either as the host material or the luminescent material, or in an electron transport layer. FIG. 1 is an exemplary electronic device 100 that includes a photoactive layer positioned between two electrical contact layers, wherein one of the layers of the device contains the organometallic complex. The electronic device 100 includes a hole transport layer 120 located between the photoactive layer 130 and an anode layer 110, and an electron transport layer 140 located between the photoactive layer 130 and a cathode layer 150. Depending on the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, phototubes, and photovoltaic cells, as described in Markus, John, *Electronics and Nucleonics* Dictionary, 470 and 476 (McGraw-Hill, Inc., 1966). The device is not limited with respect to system, driving method, and utility mode.

The electron transport layer 140 may contain a material having an ionization potential of 5.9 eV or more, more preferably from 6.0 to 7.0 eV. The hole transport layer 120 may contain a metal, an alloy, a metallic oxide, an electroconductive compound, or a mixture thereof, and preferably a material having a work function of 4 eV or more. Examples of materials that are useful for electron transport layer 140 include metal chelated oxinoid compounds, such as tris(8-hydroxyquinolato)aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). The electron transport layer 140 can function both to facilitate electron transport and to serve as a buffer layer or confinement layer that prevents quenching of the exciton at layer interfaces. Preferably, the electron transport layer 140 promotes electron mobility and reduces exciton quenching.

Examples of hole transport layer 120 are provided in, for example, Kirk-Othmer Encyclopedia of Chemical Technology, Fourth Edition, Vol. 18, p. 837-860, 1996. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a phenyl-4-N,N-diphenylaminostyrene (TPS), p-(diethylamino)-benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine. Commonly used hole transporting polymers are polyvinylcarbazole, (phenylmethyl)polysilane, and polyaniline. It is also possible to obtain hole transporting polymers by doping hole transporting molecules such as those mentioned above into polymers such as polystyrene and polycarbonate.

The anode layer 110 is generally formed as a layer on a transparent substrate, such as soda lime glass, non-alkali glass or a transparent resin substrate. The cathode is selected in consideration of adhesion to the adjacent layer. The cathode may be made of material such as metals, alloys, metallic halogenides, metallic oxides, electroconductive compounds, and mixtures thereof. Methods of forming the anode and the cathode are well known.

The organometallic complex of the invention is particularly useful in the photoactive layer 130 or in the electron transport material layer 140. The organometallic complex may be used as the light-emitting material in diodes. The layer that contains the organometallic complex may also contain other compounds. In some cases, the organometallic complex may be present in more than one isomeric form, or mixtures of different complexes may be present.

The method for forming the layer containing the organometallic complex is not particularly limited, and various methods, such as a vacuum deposition method, a Langmuir-Blodgett (LB) method, a resistance heating vapor deposition method, an electron beam method, a sputtering method, a molecular accumulation method, a coating method (such as a spin coating method, a casting method and a dip coating method), an ink jet method and a printing method, can be utilized. A resistance heating vapor deposition method and a coating method are preferred from the standpoint of characteristics and production. In particular, the coating method is advantageous in that production cost may be reduced when the light-emitting element is applied to a technology that requires a large area, such as a display.

The layer can be formed by the coating method in the following manner. The organometallic complex is dissolved in a solvent to prepare a coating composition, which is then coated on a desired layer and dried. This drying usually involves initial evaporation of solvent under ambient—room temperature and pressure conditions but may optionally also involve heating at temperatures of up to 80 C and/or vacuum drying at reduced pressures down to $10^{-6}$ torr. Such heating can be done in a vacuum oven, on a hot plate etc. The coating composition may contain a resin, and the resin may be in a dissolved state in the solvent or in a dispersed state therein. Examples of the resin include a non-conjugated system polymer (such as polyvinyl carbazole) and a conjugated system polymer (such as a phenylenevinylene or fluorene polymer).

The invention will be further described in the following examples, which do not limit the scope of the invention described in the claims.

EXAMPLES

Example 1

This example provides a method of synthesizing an organometallic complex of the invention, wherein M is Ir, the first ligand is a phenylpyridine, the second ligand is a hydride, and three additional ligands which are triphenylphosphine or chloride ion.

0.42 g of 2-(2,4-difluorophenyl)-4 methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.1 g triphenylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the fast running blue luminescent band.

Figure 2:
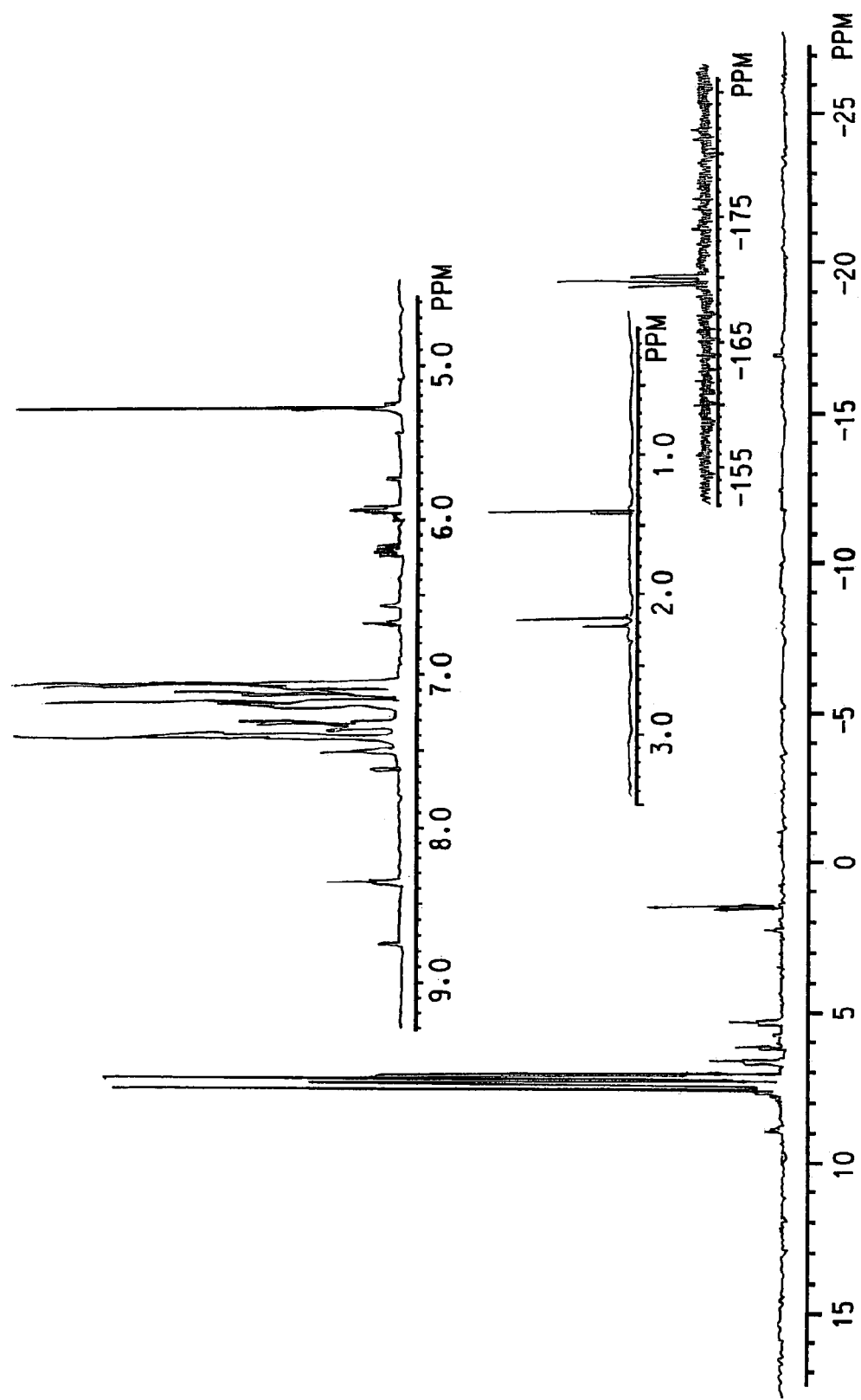
FIG. 2 is an NMR spectroscopy result of a product containing the organometallic complex of the invention.

The crude product was a mixture of a blue luminescent and a red/orange poorly-luminescent fraction. The NMR of the product, shown in FIG. 2, indicates the presence of both a hydride and a non-hydride coordination complex, both of which are monocyclometallated and with two phosphines coordinated. FIG. 2, indicates the composition of the product and shows that the product contains the chloride-hydride and the dichloride products, with the dichloride being the dominant material ($Cl_2$:Cl—H=~2:1). The chloride-hydride and the dichloride products were separated by recrystallization from methylene chloride/methanol mixtures. Alternately, separation may be achieved by further chromatography on a silica column using methylene chloride as eluent. The dichloride product was the red-orange poorly-luminescent and fastest running eluate from the column while the hydrido-chloride product was the next eluate and was brightly blue luminescent.

Figure 3:
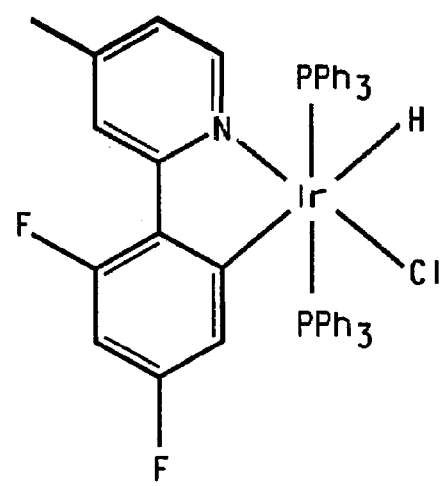
FIG. 3 is a first exemplary organometallic complex capable of emitting blue light.
Figure 4:
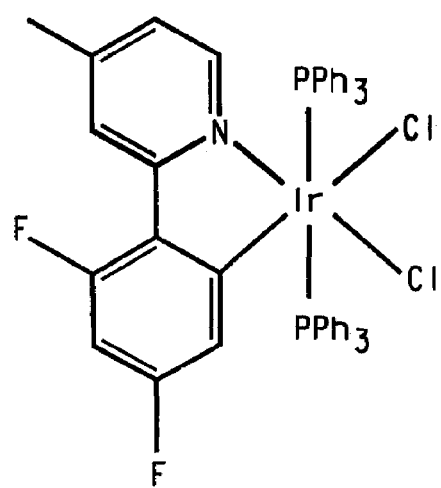
FIG. 4 is a relative of the organometallic complex of FIG. 3 that does not include a hydride ligand.

FIG. 3 is the structure of the brightly blue luminescent fraction, wherein the second ligand is a hydride. FIG. 4 is the structure of the poorly-luminescent fraction, which is the non-hydride. The poorly-luminescent fraction is not a compound of the invention, as there is no second ligand selected from hydride or aromatic carbon.

An OLED device built with this complex emitted light at about 500 nm and 580 nm. The LED peak efficiency was about 0.05 cd/A, and the peak radiance was about 14 cd/m$^2$.

Example 2

Figure 5:
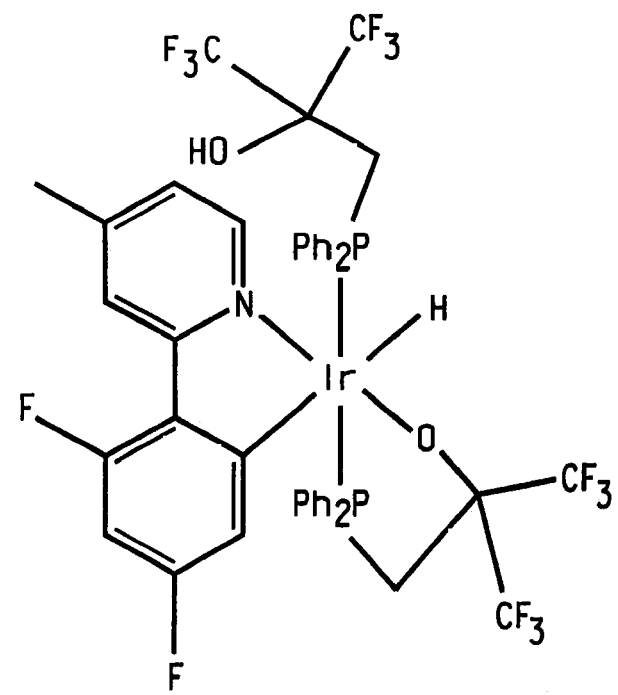
FIGS. 5, 6, 7, 8, and 9, are other exemplary organometallic complexes of the invention capable of emitting blue light.

This example provides a method of synthesizing an organometallic complex of the invention having the structure illustrated in FIG. 5.

0.21 g of the ligand 4-methyl-2-(2,4-difluorophenyl)pyridine and 0.38 g iridium chloride were refluxed in 0.5 mL of water and 4.5 mL of 2-ethoxyethanol. After 1 hour of reflux under nitrogen 0.1 g, sodium bicarbonate and 0.73 g 2-diphenylphosphino-1,1-bistrifluoromethyl-ethanol were added and the reflux was continued for approximately 30 minutes after the addition. The solvent was removed by evaporation in dry nitrogen and the resulting solid was dissolved in a minimum of methylene chloride. The solution was chromatographed on a silica column using methylene chloride as eluent. The fastest running blue luminescent band was collected and the solid recovered by evaporation was recrystallized from methylene chloride/methanol to yield pale yellow blocks. The yield was ~25%. Crystal structure analysis revealed the structure shown in FIG. 5.

An OLED device built with this complex emitted light at about 440 nm, 470 nm, and 500 nm. The LED peak efficiency ranged between 0.6-1.5 cd/A and the peak radiance was 35 cd/m$^2$. The 1931 CIE x,y coordinates were (0.167, 0.235)

Example 3

This example illustrates how to produce organometallic complexes of alternate structures and to alter the overall yield by varying the reagents.

Figure 6:
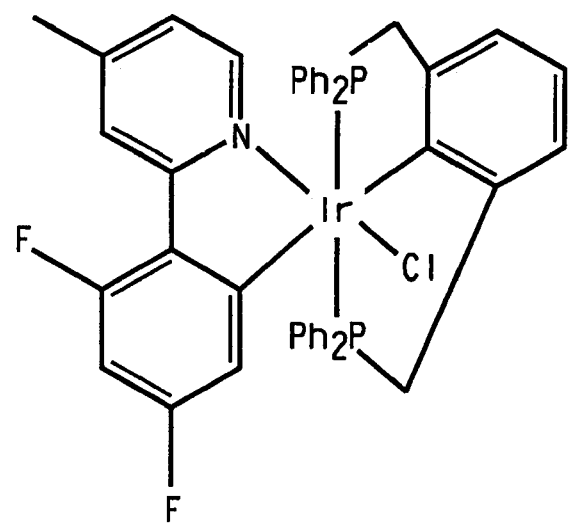

The procedure described in Example 2 was repeated except that 0.25 g sodium bicarbonate and 0.48 g of α,α'-diphenylphosphino-m-xylene were used in place of the 2-diphenylphosphino-1,1-bistrifluoromethylethanol. After recrystallization of the chromatographed blue luminescent fraction needle crystals were obtained in ~35% yield and a single crystal structure determined the struture to be that shown in FIG. 6, where the second ligand is a carbon which is part of a phenyl ring.

When built into an OLED device, this complex emitted light at about 450 nm, 480 nm, and 590 nm. The LED peak efficiency was 0.6-0.7 cd/A and the peak radiance was 400 cd/m$^2$. Color coordinates of the emitted blue light were about (0.191, 0.353) to (0.266, 0.433).

Example 4

Figure 7:
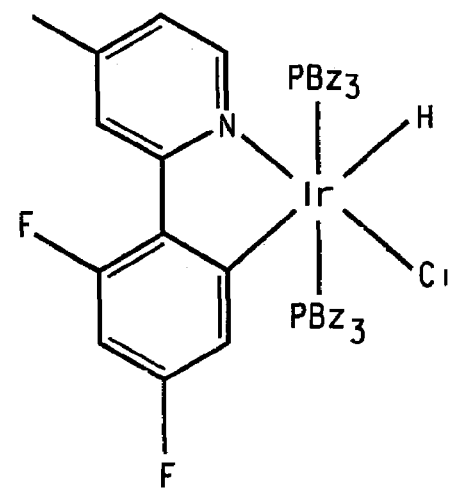

This example provides a method of synthesizing an organometallic complex of the invention having the structure is illustrated in FIG. 7.

0.42 g of 2-(2,4-difluorophenyl)-4-methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.2 g tribenzylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the various blue luminescent bands.

The crude product was a mixture of several blue luminescent materials. Separation may be achieved by repeated chromatography on a silica column using methylene chloride as eluent. The first product is that shown in FIG. 7 as determined by x-ray crystallography The complex can be built into an organic light emitting diode (OLED) device. When the complex was built into an OLED device having an approximately 303-Å layer of MPMP and an approximately 400-Å layer of DPA, the device generated light having $\lambda_{max}$=_ nm and with an LED peak efficiency of 0.5 cd/A at 20 V. The peak radiance of the device was 1.3 Cd/m$^2$.

Example 5

Figure 8:
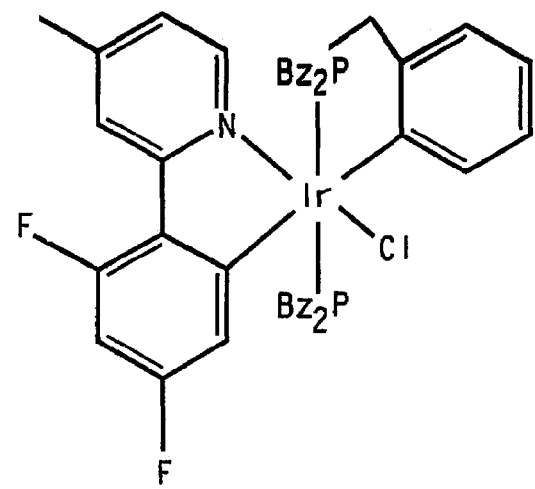

This example provides a method of synthesizing an organometallic complex of the invention having the structure illustrated in FIG. 8.

The procedure of Example 4 was repeated and a second blue luminescent material was isolated from the column chromatography. This material has the structure shown in FIG. 8.

The properties of the emitted blue light vary depending on the structure of the complex that is included in the light emitting layer. For example, when the complex of FIG. 8 was built into an OLED device that is substantially similar to the device of Example 4, the resulting device generated a blue-green light having $\lambda_{max}$=505 nm and an LED peak efficiency of 0.6 cd/A at 10 V. The peak radiance of this device was 70 cd/m$^2$ at 12 V. The device included an approximately 303-Å layer of MPMP and an approximately 402-Å layer of DPA.

Example 6

Figure 9:
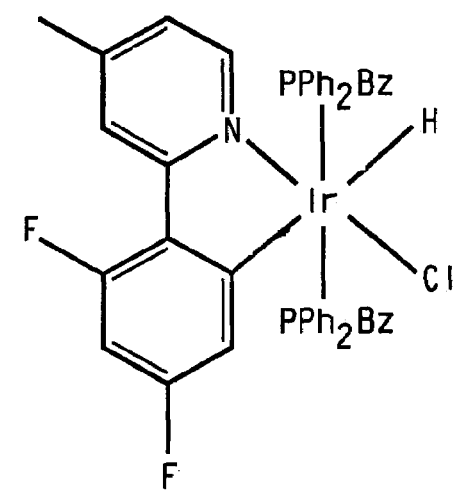

This example provides a method of synthesizing an organometallic complex of the invention, having the structure provided in FIG. 9.

0.42 g of 2-(2,4-difluorophenyl)-4 methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.2 g diphenylbenzylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the various blue luminescent bands.

The crude product was a mixture of several blue luminescent materials. Separation was achieved by chromatography on a silica column using methylene chloride as eluent. The first product was that shown in FIG. 9, as determined by nmr spectroscopy Depending on the structure of the complex, the OLED device built with the complex may have multiple luminescence peaks. When the complex of FIG. 9 was built into an OLED device including an approximately 302-Å layer of MPMP and an approximately 261-Å layer of DPA, the device generated light having $\lambda_{max}$=505 nm and 580 nm, with an LED peak efficiency of 0.7 cd/A at 11 V. The peak radiance of this device was 60 cd/m$^2$ at 15 V.

Example 7

This example illustrates the preparation of a compound which, when deprotonated, is a ligand having Formula V, 2-(2,4-difluorophenyl)4-carbazole-pyridine.

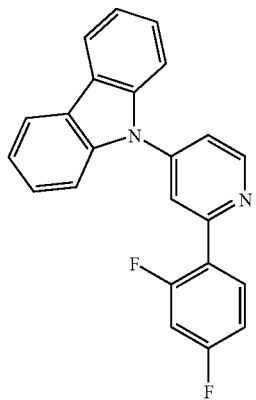

Under an atmosphere of nitrogen a mixture of 2-(2,4-difluorophenyl)-4-chloropyridine (2.314 g, 10 mmol), carbazole (1.83 g, 8 mmol), NaOtBu (1.47 g, 15.8 mmol), Pd$_2$(dba)$_3$ (0.200 g, 0.2 mmol) and P$^t$Bu$_3$ (0.14 g, 0.7 mmol) in toluene (30 mL) was heated to 100 C for five days. The resulting mixture was diluted with methylene chloride and filtered through a plug of silica and celite. Upon evaporation of the solvent a dark brown viscous material was obtained which was purified by washing with hexanes to form a light brown precipitate, then chromatography on silica (EtOAC/hexanes 1/10) to yield the desired product as a white powder (1.6 g, 45%). $^{19}$F NMR (CD$_2$Cl$_2$ 400 MHz) δ −113.6, −109.8.

Example 8

This example illustrates the preparation of a blue luminescent composition, Compound A.

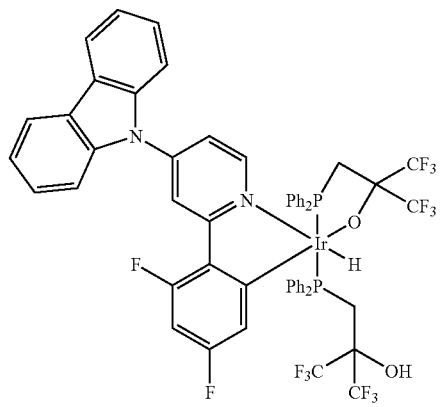

Compound A

To 0.18 g of the compound made in Example 7, was added 0.19 g iridium chloride in 10 mL 2-ethoxyethanol and 1 mL water. This was refluxed under nitrogen for 30 minutes. The mixture was allowed to cool. To the cooled mixture was added 0.37 g of 1,1-bis(trifluoromethyl)-2-(diphenylphosphino)ethanol and 200 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound A, above. Yield 0.12 g.

The photoluminescence spectrum of Compound A in toluene had emission maxima at 449 and 476.5 nm. The CIE coordinates were x=0.14 and y=0.14.

Example 9

This example illustrates the preparation of a compound which, when deprotonated, is a ligand having Formula V, 2-(2,4-difluoro-3-perfluoroisopropyl-phenyl)-4-tetrahydrocarbazole-pyridine.

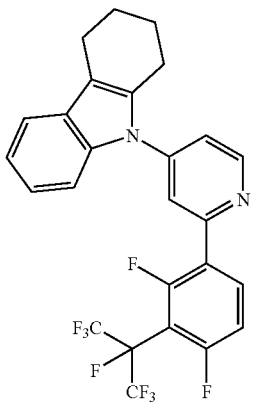

22.4 mg (0.1 mmol) of palladium acetate, 35 mg (0.1 mmol) of 2-(dicyclohexylphosphino)biphenyl, 0.6727 grams (7 mmol) of sodium t-butoxide, 0.9840 grams (2.5 mmol) of 2-(2,4-difluorophenyl)-4-chloropyridine, and 0.5137 grams (3 mmol) of tetrahydrocarbazole were mixed with 60 ml of toluene and refluxed for 48 hours. The reaction contents were cooled to room temperature, diluted with dichloromethane and preabsorbed onto silica and chromatographed to isolate 880 mg of product in 67% yield.

Example 10

Compound C

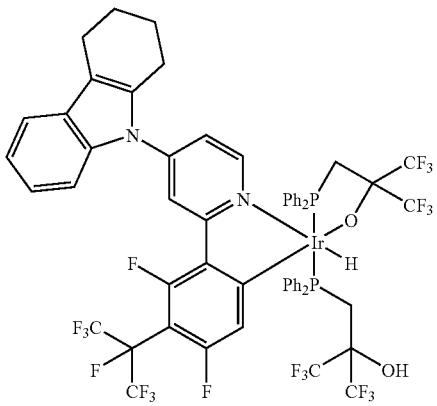

To 0.27 g of the compound made in Example 9, was added 0.19 g iridium chloride in 10 mL 2-ethoxyethanol and 1 mL water. This was refluxed under nitrogen for 30 minutes. The mixture was allowed to cool. To the cooled mixture was added 0.37 g of 1,1-bis(trifluoromethyl)-2-(diphenylphosphino)ethanol and 100 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from hexanes as a slightly yellow crystalline powder. Nmr analysis confirmed the structure as Compound C, above. Yield 0.14 g.

The photoluminescence spectrum of Compound C in toluene had emission maxima at 444 and 470 nm. The CIE coordinates were x=0.14 and y=0.13.

Example 11

This example illustrates the preparation of a compound which, when deprotonated, is a ligand having Formula V, 2-(2,4-difluoro-phenyl)-4-indolyl-pyridine.

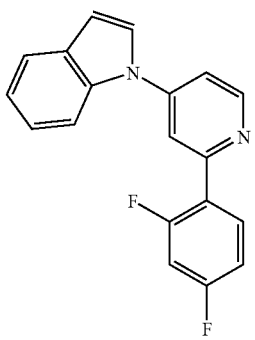

44.9 mg (0.2 mmol) of palladium acetate, 70 mg (0.2 mmol) of 2-(dicyclohexylphosphino)biphenyl, 1.3455 grams (14 mmol) of sodium t-butoxide, 1.1281 grams (5 mmol) of 2-(2,4-difluorophenyl)-4-chloropyridine, and 0.7029 grams (6 mmol) of indole were mixed with 60 ml of toluene and refluxed for 48 hours. Next a double portion of the catalyst package and one more portion of indole was added to the mixture to reflux for 72 hours. The reaction contents were cooled to room temperature, diluted with dichloromethane and preabsorbed onto silica and chromatographed to isolate 0.978 grams of yellow solid in 63% yield.

Example 12

Compound B

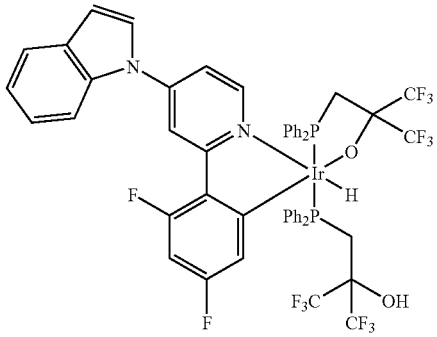

To 0.31 g of the compound made in Example 11, was added 0.38 g iridium chloride in 10 mL 2-ethoxyethanol and 1 mL water. This was refluxed under nitrogen for 30 minutes. The mixture was allowed to cool. To the cooled mixture was added 0.74 g of 1,1-bis(trifluoromethyl)-2-(diphenylphosphino)ethanol and 250 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound B, above. Yield 0.26 g.

The photoluminescence spectrum of Compound B in toluene had emission maxima at 448 and 474 nm. The CIE coordinates were x=0.14 and y=0.16.

Example 13

This example illustrates the preparation of a compound which, when deprotonated, is a ligand having Formula V, 2-(2,4-difluoro-phenyl)-4-pyrrolyl-pyridine.

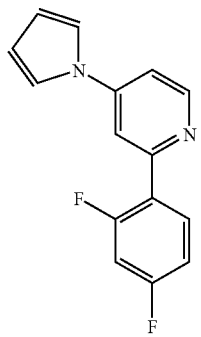

44.9 mg (0.2 mmol) of palladium acetate, 70 mg (0.2 mmol) of 2-(dicyclohexylphosphino)biphenyl, 0.6727 grams (7 mmol) of sodium t-butoxide, 1.1281 grams (5 mmol) of 2-(2,4-difluorophenyl)-4-chloropyridine, and 0.4025 grams (6 mmol) of pyrrole were mixed with 60 ml of toluene and refluxed for 48 hours. The reaction contents were cooled to room temperature, diluted with dichloromethane and preabsorbed onto silica and chromatographed to isolate 70 mg of product in 5% yield.

Example 14

Compound D

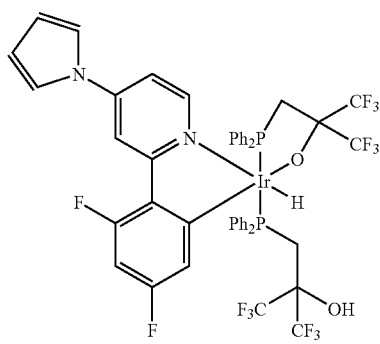

To 0.07 g of the compound made in Example 13, was added 0.10 g iridium chloride in 5 mL 2-ethoxyethanol and 0.5 mL water. This was refluxed under nitrogen for 30 minutes. The mixture was allowed to cool. To the cooled mixture was added 0.19 g of 1,1-bis(trifluoromethyl)-2-(diphenylphosphino)ethanol and 50 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound D, above. Yield 0.05 g.

The photoluminescence spectrum of Compound D in toluene had emission maxima at 450 and 473 nm. The CIE coordinates were x=0.15 and y=0.16.

Example 15

This example illustrates the preparation of a compound which, when deprotonated, is a ligand having Formula V, 2-(2,4-difluoro-phenyl)-4-indolinyl-pyridine.

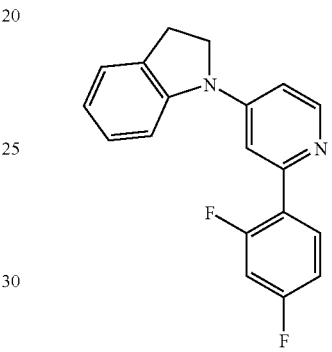

44.9 mg (0.2 mmol) of palladium acetate, 70 mg (0.2 mmol) of 2-(dicyclohexylphosphino)biphenyl, 1.3455 grams (14 mmol) of sodium t-butoxide, 1.1281 grams (5 mmol) of 2-(2,4-difluorophenyl)-4-chloropyridine, and 0.7149 grams (6 mmol) of indoline were mixed with 60 ml of toluene and refluxed for 48 hours. The reaction contents were cooled to room temperature, diluted with dichloromethane and preabsorbed onto silica and chromatographed to isolate 1.23 grams of off white solid in 80% yield.

Example 16

Compound E

To 0.31 g of the compound made in Example 15, was added 0.38 g iridium chloride in 10 mL 2-ethoxyethanol and 1 mL water. This was refluxed under nitrogen for 30 minutes. The mixture was allowed to cool. To the cooled mixture was added 0.74 g of 1,1-bis(trifluoromethyl)-2-(diphenylphosphino)ethanol and 250 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound E, above mixed with a small amount of the compound C resulting from oxidation of indoline to indole during synthesis. Yield 0.19 g.

Example 17

This example illustrates the preparation of a compound which, when deprotonated, is a ligand having Formula V, 2-(2,4-difluoro-3-perfluoro-i-propyl-phenyl)-4-carbazolyl-pyridine.

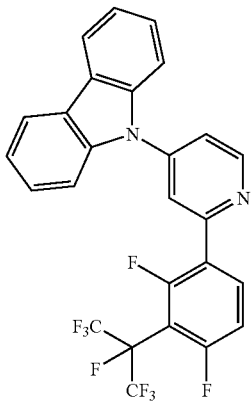

Example 18

Compound F

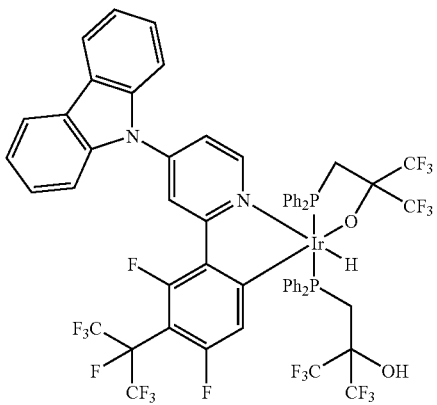

To 0.26 g of the compound made in Example 17, was added 0.19 g iridium chloride in 10 mL 2-ethoxyethanol and 1 mL water. This was refluxed under nitrogen for 30 minutes. The mixture was allowed to cool. To the cooled mixture was added 0.37 g of 1,1-bis(trifluoromethyl)-2-(diphenylphosphino)ethanol and 200 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound F, above. Yield 0.05 g.

The photoluminescence spectrum of Compound F in toluene had emission maxima at 447 and 471 nm. The CIE coordinates were x=0.14 and y=0.14.

Example 19

This example illustrates the preparation of a compound which, when deprotonated, is a ligand having Formula V, 2-(2,4-difluoro-phenyl)-4-(2,7-dimethoxy)-carbazolyl-pyridine.

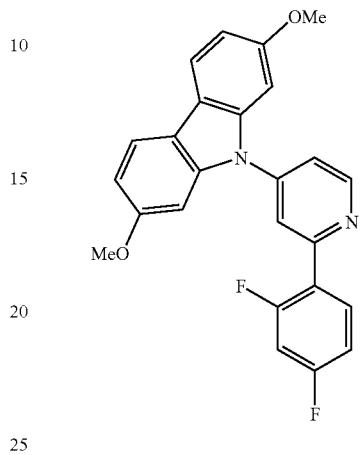

Example 20

Compound G

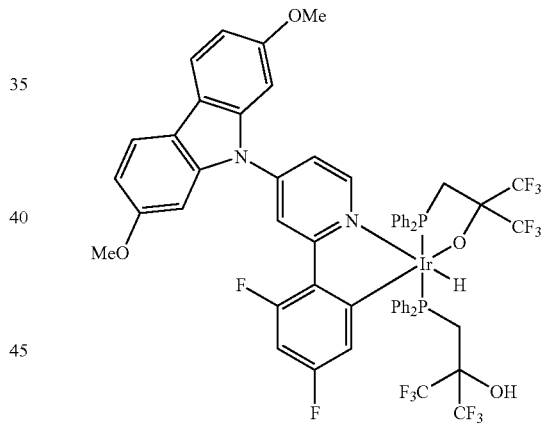

To 0.14 g of the compound made in Example 19, was added 0.13 g iridium chloride in 10 mL 2-ethoxyethanol and 1 mL water. This was refluxed under nitrogen for 30 minutes. The mixture was allowed to cool. To the cooled mixture was added 0.25 g of 1,1-bis(trifluoromethyl)-(diphenylphosphino)ethanol and 60 mg sodium bicarbonate, and the mixture was refluxed for 30 minutes. The mixture was then cooled and, evaporated to dryness in a nitrogen stream. It was extracted into methylene chloride and filtered. It was again evaporated to dryness and chromatographed on a silica column using toluene eluent to isolate the blue luminescent fraction. This was crystallized from toluene/hexanes as a slightly yellow crystalline powder. Nmr analysis confirmed the structure as Compound G, above. Yield 0.09 g.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. An organometallic complex composition of matter, the composition comprising:
    a hexacoordinate transition metal, M, selected from Ir, Os, Ru, and Rh;
    a first monoanionic bidentate ligand having Formula V

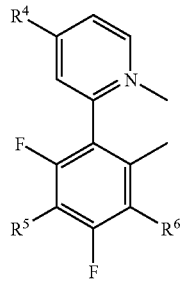

Formula V a hydride ligand;
a second monoanionic bidentate ligand comprising a phosphino alkoxide; and
a monodentate phosphine ligand;
wherein
$R^4$ is a group comprising an unsaturated 5-membered heteroring containing nitrogen and attached via the nitrogen, and
$R^5$ and $R^6$ are independently selected from H, alkyl, fluoroalkyl, fluoroalkylsulfonate, alkoxy, fluoroalkoxy, carboxyl, and cyano, and $R^5$ is also selected from —C(CF$_3$)OCH$_3$.

2. A complex according to claim 1, wherein $R^4$ is selected from carbazole and indole groups.

3. A complex according to claim 1, wherein $R^4$ is selected from

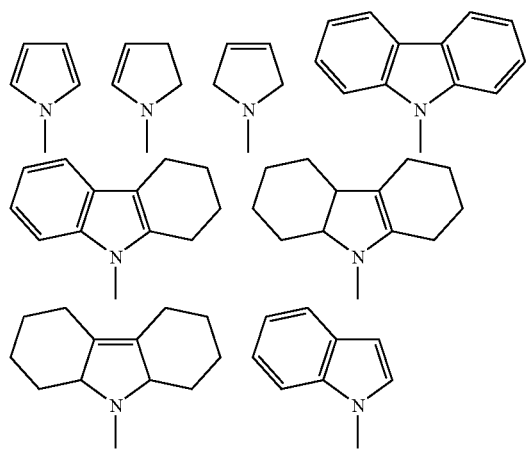

4. A complex according to claim 3, wherein the heteroring of $R^4$ is selected from an aromatic pyrrole-type ring and a non-aromatic dihydropyrrole-type ring.

5. A complex according to claim 1, wherein $R^5$ is selected from H, alkyl and fluoroalkyl.

6. A complex according to claim 1, wherein $R^5$ is selected from H, —CF$_3$, —C$_3$F$_7$, and —C(CF$_3$)OCH$_3$.

7. A complex according to claim 1, wherein $R^6$ is H.

8. A complex according to claim 1, wherein the phosphino alkoxide ligand has Formula VI:

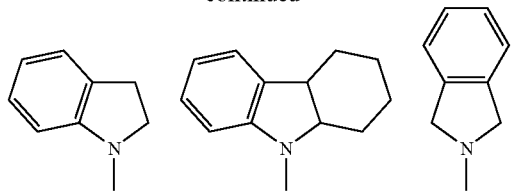

Formula VI wherein:
$R^7$ can be the same or different at each occurrence and is selected from H and C$_n$(H+F)$_{2n+1}$,
$R^8$ can be the same or different at each occurrence and is selected from C$_n$(H+F)$_{2n+1}$ and C$_6$(H+F)$_5$, or C$_6$H$_{5-b}$(R$^9$)$_b$,
$R^9$=CF$_3$, C$_2$F$_5$, n-C$_3$F$_7$, i-C$_3$F$_7$, C$_4$F$_9$, CF$_3$SO$_2$, and
a is 2 or 3;
b is 0-5; and
n is 1-20.

9. A complex according to claim 8, wherein $R^8$ is selected from C$_6$F$_5$ and C$_6$H$_c$Y$_{5-c}$, where Y is CF$_3$ and c is 3 or 4.

10. A complex according to claim 8, wherein at least one of $R^7$ is CF$_3$ and a is 2.

11. A complex according to claim 1, wherein the phosphino alkoxide is selected from 1-diphenylphosphino-2-propoxide; 1,1-bis(trifluoromethyl)-2-(diphenylphosphino)ethoxide; 1,1-bis(trifluoromethyl)-2-(bis(3'5'-ditrifluoromethylphenyl)phosphino)ethoxide; 1,1-bis(trifluoromethyl)-2-(bis(4'-trifluoromethylphenyl)phosphino)ethoxide; and 1,1-bis(trifluoromethyl)-2-(bis(pentafluorophenyl)phosphino)ethoxide.

12. A complex according to claim 1, wherein the monodentate phosphine ligand has Formula VII:

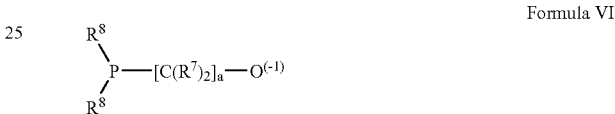

Formula VII wherein:
Ar is selected from aryl, fluoroaryl, heteroaryl, and fluoroheteroaryl, and
$R^{10}$ is selected from aryl, fluoroaryl, heteroaryl, fluoroheteroaryl, alkyl, fluoroalkyl, alkanol, and fluoroalkanol.

13. A complex according to claim 1, wherein M is Ir.

14. A complex according to claim 1, selected from Compounds A through G:

Compound A
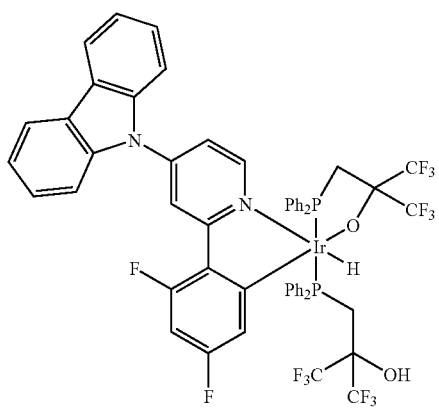
Compound B
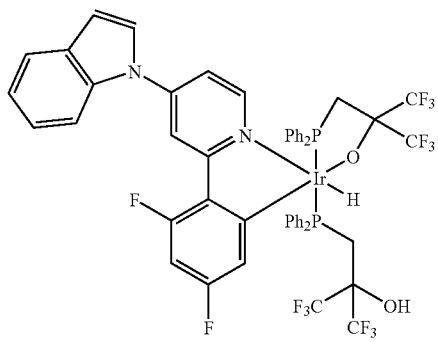
Compound C
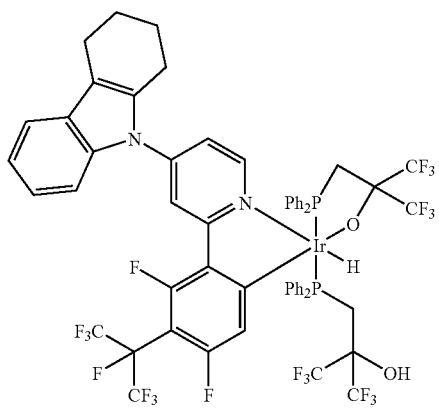
Compound D
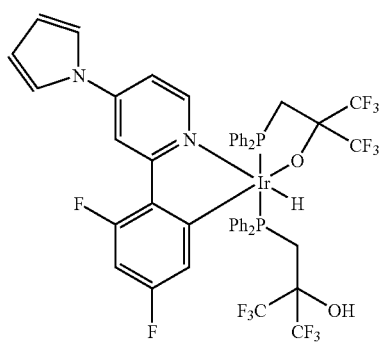
Compound E
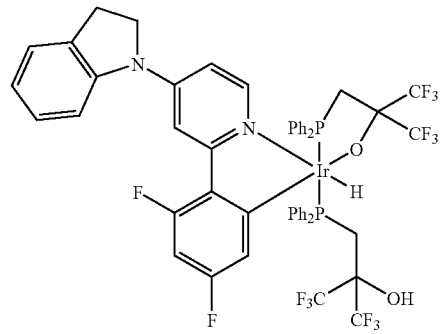
Compound F
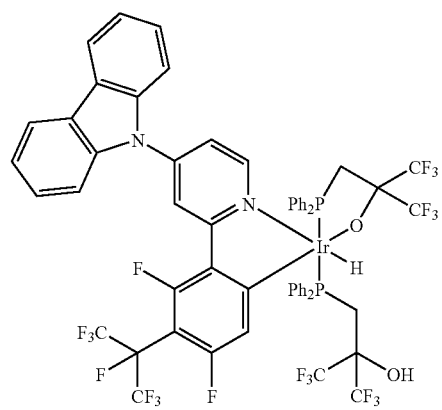
Compound G
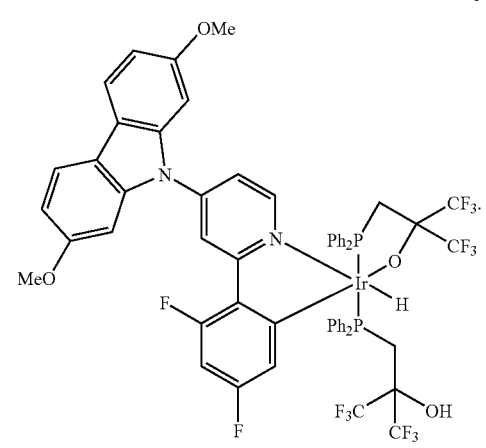
15. An electronic device including a light-emitting layer comprising at least one organometallic complex composition of matter, the composition comprising:
a hexacoordinate transition metal, M, selected from Ir, Os, Ru, and Rh;
a first monoanionic bidentate ligand having Formula V

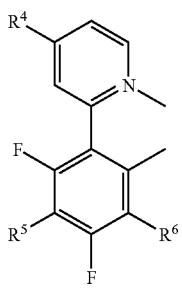

Formula V a hydride ligand;
a second monoanionic bidentate ligand comprising a phosphino alkoxide; and
a monodentate phosphine ligand;
wherein
  $R^4$ is a group comprising an unsaturated 5-membered heteroring containing nitrogen and attached via the nitrogen, and
  $R^5$ and $R^6$ are independently selected from H, alkyl, fluoroalkyl, fluoroalkylsulfonate, alkoxy, fluoroalkoxy, carboxyl, and cyano.

16. A device according to claim 15, wherein $R^4$ is selected from carbazole groups and indole groups.

17. A device according to claim 15, wherein $R^4$ is selected from the groups below:

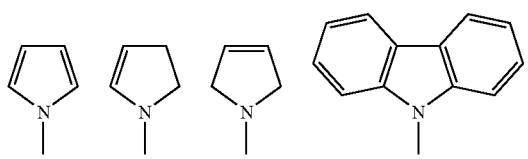

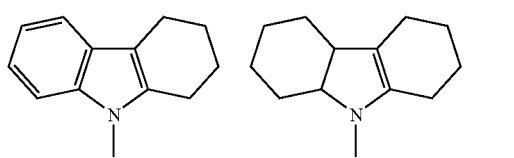

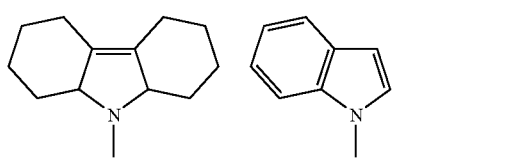

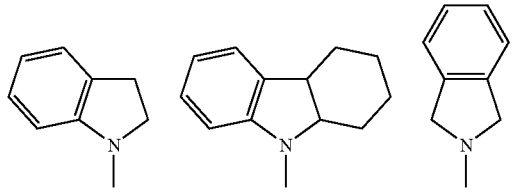

18. A device according to claim 15, wherein $R^5$ is selected from H, alkyl and fluoroalkyl.

19. A device according to claim 15, wherein the phosphino alkoxide has Formula VI:

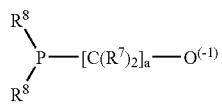

Formula VI where $R^7$ can be the same or different at each occurrence and is selected from H and $C_n(H+F)_{2n+1}$, $R^8$ can be the same or different at each occurrence and is selected from $C_n(H+F)_{2n+1}$ and $C_6(H+F)_5$, or $C_6H_{5-b}(R^9)_b$, $R^9=CF_3$, $C_2F_5$, n-$C_3F_7$, i-$C_3F_7$, $C_4F_9$, $CF_3SO_2$, and a is 2 or 3;

b is 0-5; and n is 1-20.

20. A device according to claim 19, wherein $R^8$ is selected from $C_6F_5$ and $C_6H_cY_{5-c}$, where Y is $CF_3$ and c is 3 or 4.

21. A device according to claim 19, wherein at least one of $R^7$ is $CF_3$ and a is 2.

22. A device according to claim 15, wherein the organometallic complex composition is selected from Compounds A through G:

Compound A

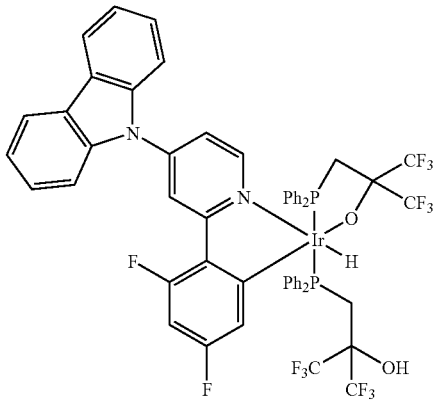

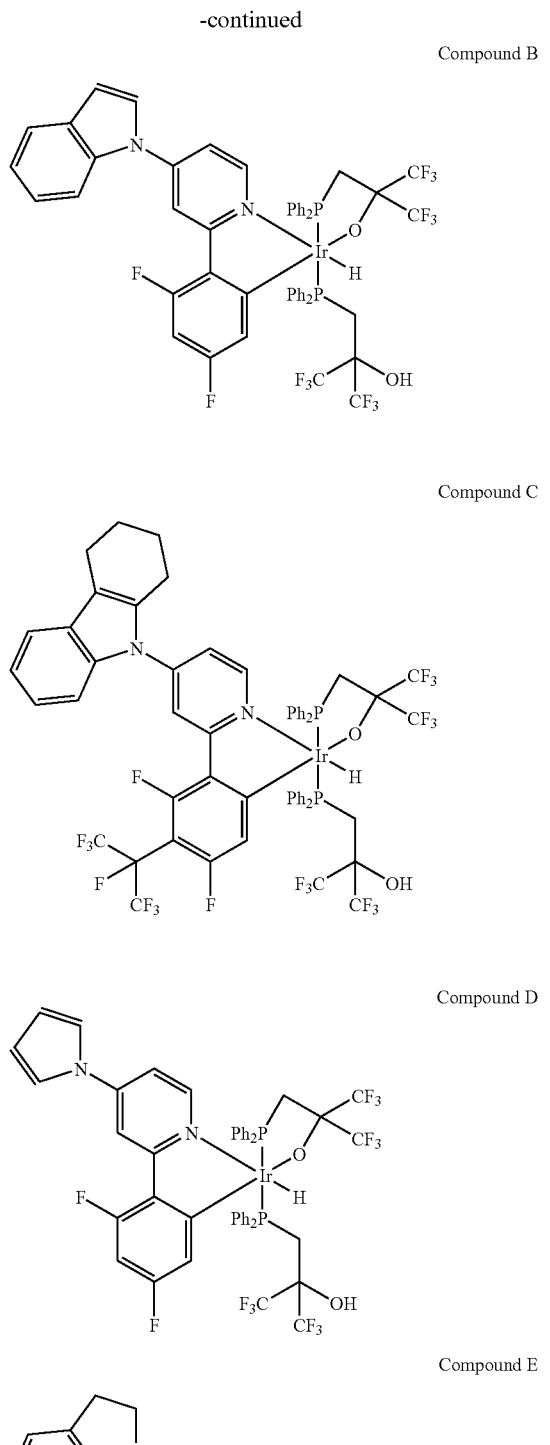

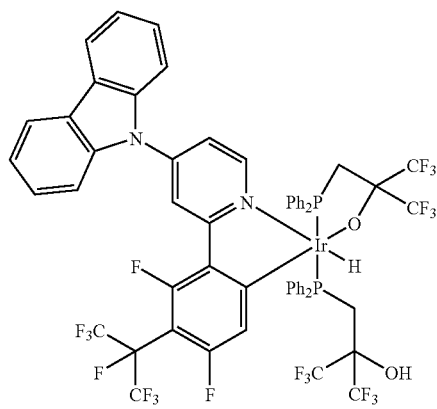

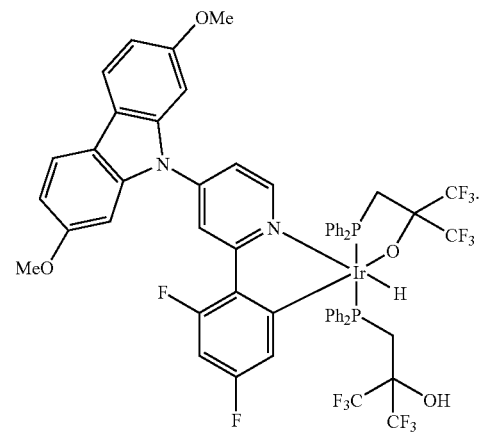

23. An electronic device comprising:
a photoactive layer for emitting light;
an electrode layer; and
a layer of charge transport material located between the photoactive layer and the electrode layer, wherein at least one of the photoactive layer, the electrode layer, and the layer of charge transport material includes an organometallic complex comprising:
a hexacoordinate transition metal, M, selected from Ir, Os, Ru, and Rh;
a first monoanionic bidentate ligand having Formula V

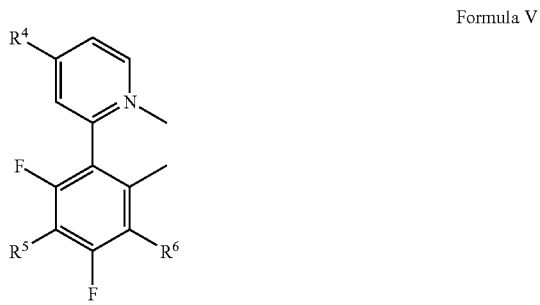

a hydride ligand;

a second monoanionic bidentate ligand comprising a phosphino alkoxide; and a monodentate phosphine ligand;

wherein $R^4$ is a group comprising an unsaturated 5-membered heteroring containing nitrogen and attached via the nitrogen, and $R^5$ and $R^6$ are independently selected from H, alkyl, fluoroalkyl, fluoroalkylsulfonate, alkoxy, fluoroalkoxy, carboxyl, and cyano.

24. A method of generating blue light, the method comprising:

providing an organometallic complex comprising:

a hexacoordinate transition metal, M, selected from Ir, Os, Ru, and Rh;

a first monoanionic bidentate ligand having Formula V

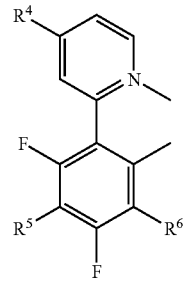

Formula V a hydride ligand;
a second monoanionic bidentate ligand comprising a phosphino alkoxide; and
a monodentate phosphine ligand;
wherein
$R^4$ is a group comprising an unsaturated 5-membered heteroring containing nitrogen and attached via the nitrogen, and
$R^5$ and $R^6$ are independently selected from H, alkyl, fluoroalkyl, fluoroalkylsulfonate, alkoxy, fluoroalkoxy, carboxyl, and cyano; and
stimulating the organometallic complex to trigger phosphorescent emission.

* * * * *